United States Patent
Tsuji

(10) Patent No.: US 10,236,348 B2
(45) Date of Patent: Mar. 19, 2019

(54) SILICON CARBIDE SEMICONDUCTOR DEVICE WITH DOUBLE TRENCH AND METHOD OF MAKING SAME

(71) Applicant: Fuji Electric Co., Ltd., Kanagawa (JP)

(72) Inventor: Takashi Tsuji, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/724,188

(22) Filed: Oct. 3, 2017

(65) Prior Publication Data

US 2018/0138273 A1 May 17, 2018

(30) Foreign Application Priority Data

Nov. 15, 2016 (JP) .................................. 2016-222773

(51) Int. Cl.
*H01L 29/10* (2006.01)
*H01L 29/16* (2006.01)
(Continued)

(52) U.S. Cl.
CPC ...... *H01L 29/1608* (2013.01); *H01L 29/0865* (2013.01); *H01L 29/1095* (2013.01);
(Continued)

(58) Field of Classification Search
CPC . H01L 29/1608; H01L 29/7813; H01L 29/36; H01L 29/32; H01L 29/4236; H01L 29/1095; H01L 29/66348; H01L 29/1004; H01L 29/7395; H01L 29/7397; H01L 29/66734

See application file for complete search history.

(56) References Cited

U.S. PATENT DOCUMENTS 5,399,506 A 3/1995 Tsukamoto
5,825,066 A 10/1998 Buynoski
(Continued)

FOREIGN PATENT DOCUMENTS

JP 2007-243080 A1 9/2007
JP 2014-33223 A1 2/2014
(Continued)

OTHER PUBLICATIONS

Mitani et al., "Depth Profiling of Al Ion-Implantation Damage in SiC Crystals by Cathodoluminescence Spectroscopy", Materials Science Forum, vols. 600-603 (2009) pp. 615-618.
(Continued)

*Primary Examiner* — Khiem D Nguyen
(74) *Attorney, Agent, or Firm* — Chen Yoshimura LLP

(57) ABSTRACT

A silicon carbide semiconductor device includes an n-type drift layer and a p-type epitaxial base layer deposited on an n-type silicon carbide substrate, as well as first trenches and second trenches. N-type source regions are formed in the surface layer of the p-type epitaxial base layer, in the sidewalls of the first trenches, and in the bottoms of the first trenches. The thickness of the p-type epitaxial base layer is set so that a concentration of ion species or point defects running along dislocations in the p-type epitaxial base layer is so low that regions surrounding the dislocations do not conduct current due to the ion species or the point defects.

4 Claims, 5 Drawing Sheets

(51) Int. Cl.
*H01L 29/08* (2006.01)
*H01L 29/423* (2006.01)
*H01L 29/417* (2006.01)
*H01L 29/66* (2006.01)
*H01L 29/32* (2006.01)
*H01L 29/36* (2006.01)
*H01L 29/78* (2006.01)
*H01L 29/739* (2006.01)

(52) U.S. Cl.
CPC ............ *H01L 29/32* (2013.01); *H01L 29/36* (2013.01); *H01L 29/41741* (2013.01); *H01L 29/4236* (2013.01); *H01L 29/66068* (2013.01); *H01L 29/66734* (2013.01); *H01L 29/7813* (2013.01); *H01L 29/1004* (2013.01); *H01L 29/66348* (2013.01); *H01L 29/7397* (2013.01)

(56) References Cited

U.S. PATENT DOCUMENTS

| | | | |
|---|---|---|---|
| 7,470,960 B1* | 12/2008 | Sugawara | H01L 29/0634 257/401 |
| 7,595,238 B2* | 9/2009 | Tsuji | H01L 21/047 438/259 |
| 7,821,014 B2 | 10/2010 | Yonezawa et al. | |
| 8,415,671 B2* | 4/2013 | Zhang | H01L 29/0623 257/66 |
| 2007/0210316 A1 | 9/2007 | Yonezawa et al. | |
| 2008/0076222 A1* | 3/2008 | Zundel | H01L 29/4236 438/270 |
| 2011/0254010 A1 | 10/2011 | Zhang | |
| 2012/0228637 A1* | 9/2012 | Nakabayashi | H01L 21/046 257/77 |
| 2012/0319199 A1* | 12/2012 | Zeng | H01L 29/407 257/334 |
| 2013/0175548 A1* | 7/2013 | Kudou | H01L 21/02164 257/77 |
| 2018/0138287 A1 | 5/2018 | Tsuji | |

FOREIGN PATENT DOCUMENTS

JP 2014-146757 A1 8/2014
JP 2015-76592 A1 4/2015

OTHER PUBLICATIONS

Tanaka et al., "Electrical activation of the ion-implanted phosphorus in 4H-SiC by excimer laser annealing", Journal of Applied Physics, May 15, 2003, vol. 93, No. 10, pp. 5934-5936 (Cited in the related U.S. Appl. No. 15/724,181.).
U.S. Appl. No. 15/724,181, filed Oct. 3, 2017.

* cited by examiner

SILICON CARBIDE SEMICONDUCTOR DEVICE WITH DOUBLE TRENCH AND METHOD OF MAKING SAME

BACKGROUND OF THE INVENTION

Technical Field

The present invention relates to a silicon carbide semiconductor device using silicon carbide (SiC) as the semiconductor material and to a method of manufacturing the silicon carbide semiconductor device.

Background Art

In vertical power devices that use a silicon carbide semiconductor, the dielectric breakdown field strength at which avalanche breakdown occurs is approximately 10 times greater than in silicon (Si) semiconductor vertical power devices. This makes it possible to make the ON-resistance per unit area $R_{on,sp}$ given by the following equation several hundredths that of silicon vertical power devices. Here, $E_C$ is dielectric breakdown field strength, $\mu$ is electron mobility, $\varepsilon_{SiC}$ is the permittivity of silicon carbide, and BV is the breakdown voltage of the device.

$$R_{on,sp} = 4BV^2/\varepsilon_{SiC}\mu E_C^3$$

Therefore, using silicon carbide power devices in power electronics circuits such as inverter circuits makes it possible to reduce system loss by several dozen percent relative to when using silicon power devices. For this reason, silicon carbide power devices are being used in an increasingly wide range of applications in industry.

Among silicon carbide vertical power devices, metal-oxide-semiconductor field-effect transistors (MOSFETs) are used particularly widely due to the ability for the gate to be voltage-driven and the low power consumption of the associated gate drivers, for example. The ON-resistance of a MOSFET is equal to the sum of the source metal contact resistance, source resistance, MOS channel resistance, JFET resistance, drift resistance, substrate resistance, and rear surface drain contact resistance. In relatively low withstand voltage classes such as the 600V or 1200V class, the MOS channel resistance accounts for the largest percentage of the overall ON-resistance among these components. Moreover, one extremely effective way to reduce MOS channel resistance is to reduce the cell pitch.

However, in so-called planar MOSFET structures in which the MOS channel is formed parallel to the principal surface, JFET resistance arises in the upper portion of the drift layer sandwiched between the base layers of adjacent cells. Here, reducing the cell pitch increases this JFET resistance. Therefore, in planar MOSFETs, ON-resistance cannot be sufficiently reduced even if the cell pitch is reduced.

Trench MOSFETs in which the gate electrode is formed inside a trench have been proposed as one solution to this problem. FIG. 6 is a cross-sectional view illustrating the structure of a conventional trench MOSFET. As illustrated in FIG. 6, this trench MOSFET includes trenches 107 formed in the principal surface, gate oxide films 108 formed on sidewalls of the trenches, and gate electrodes 109 formed inside the trenches and made of polysilicon doped to a high concentration with n-type or p-type impurities. Trench MOSFETs do not exhibit JFET resistance, and therefore the more the cell pitch is reduced, the more channel resistance decreases and the more the overall ON-resistance decreases.

Thus, trench MOSFETs are currently being actively developed as the next-generation successor to planar MOSFETs. Currently, various approaches are being used to develop technologies for forming trenches, technologies for forming high-quality gate oxide films on the sidewalls of trenches, and technologies for reducing the strength of electric fields applied to gate oxide films due to electric field concentration at the bottoms of trenches.

Next, a method of manufacturing such a trench MOSFET will be described with reference to FIG. 6. First, an n-type semiconductor substrate 102, an n-type drift layer 103 epitaxially grown on the n-type semiconductor substrate 102, and a p-type base layer 104 epitaxially grown on the n-type drift layer 103 are sequentially formed. Next, phosphorus (P), nitrogen (N), and arsenic (As) are selectively ion-implanted as n-type ion species and aluminum (Al) and boron (B) are selectively ion-implanted as p-type ion species, and high temperature annealing is performed at approximately 1600° C. to respectively form n-type source regions 105 and a p-type base contact region 106. Then, trenches 107 are formed using a process such as reactive ion etching (RIE). Next, gate oxide films 108 arranged on the sidewalls of the trenches 107, gate electrodes 109 made of high concentration n-type or p-type polycrystalline silicon, and interlayer insulating films 110 that insulate the gate and source are sequentially formed. Finally, a rear surface drain ohmic contact electrode 101, an ohmic contact for the n-type source regions 105 and the p-type base contact region 106, and a source electrode 111 are formed, thereby completing the device.

MOSFETs that use a silicon carbide semiconductor are switched OFF by applying 0V to the source electrode, applying 0V or a negative bias to the gate electrode, and applying a positive rated voltage (+600V for a 600V rating or +1200V for a 1200V rating) to the drain electrode. Here, although planar MOSFETs exhibit a sufficiently low leakage current $I_{DSS}$ that is typically less than or equal to $2\times10^{-6}$ A/cm$^2$, trench MOSFETs made of a silicon carbide semiconductor using the method of manufacturing described above exhibit a large leakage current $I_{DSS}$ on the order of $10^{-3}$ A/cm$^2$ to $10^{-1}$ A/cm$^2$ and thus exhibit non-negligibly large power loss in the OFF state.

Various methods have been proposed for reducing leakage current in trench MOSFETs. For example, one proposed technology involves forming a second electrode contacting a first region of a second conductivity type at a first bottom of a first trench and also contacting a region of a first conductivity type and a second region of the second conductivity type at a first sidewall of the first trench (see Patent Document 1, for example). Another proposed technology involves forming a p$^+$ body contact region and an n$^+$ source region separated from one another in the surface layer of a p-type base layer and then forming a second trench contacting the n$^+$ source region and reaching an n drift layer (see Patent Document 2, for example).

RELATED ART DOCUMENTS

Patent Documents

Patent Document 1: Japanese Patent Application Laid-Open Publication No. 2015-76592

Patent Document 2: Japanese Patent Application Laid-Open Publication No. 2014-33223

SUMMARY OF THE INVENTION

As described above, trench MOSFETs tend to exhibit problematically large leakage currents. FIG. 7 is an emission image of a silicon carbide trench MOSFET chip with high leakage current. Emission images are captured with a photoemission microscope that can detect small amounts of light emitted when a semiconductor device such as a SiC device operates abnormally. The emission image in FIG. 7 was taken when the drain-source voltage $V_{DSS}$ was 600V and the leakage current $I_{DSS}$ was $3\times10^{-2}$ A/cm². Moreover, FIG. 8 is an etch pit image of the substrate surface of the silicon carbide trench MOSFET chip with high leakage current. The etch pit image in FIG. 8 was captured by removing the non-silicon carbide films to expose the surface of the silicon carbide substrate after capturing the emission image, etching with molten KOH (potassium hydroxide), and then imaging the resulting etch pits (corrosion holes in the surface).

The etch pits correspond to threading dislocations such as screw dislocations and edge dislocations. When working with hexagonal crystal structures in 4H or 6H silicon carbide substrates or the like, these threading dislocations are known to occur along the c-axis (the <0001> direction) of the hexagonal lattice. For example, the screw dislocation indicated by the reference character a in FIG. 6 extends from the front surface of the p-type base layer 104 to the rear surface of the n-type semiconductor substrate 102. In the Miller index notation used in the present specification, the symbol—indicates a bar to be applied to the immediately following index; that is, the symbol—is inserted before an index to indicate that that index is negative.

Overlaying the emission points from the emission image in FIG. 7 (indicated by the circles) onto FIG. 8 (indicated again by the circles) makes it clear that KOH etch pits are present near these points and that the leakage current $I_{DSS}$ occurs near threading dislocations.

Thus, the present inventor found that the ion-implanted ion species or point defects formed during formation of the n-type source regions 105 diffuse along screw dislocations during the high temperature annealing described above and thereby convert the regions surrounding the screw dislocations to n-type. Moreover, the screw dislocations extend from the front surface of the p-type base layer 104 to the rear surface of the n-type semiconductor substrate 102. Therefore, the screw dislocations together with the surrounding n-type regions create conductive paths between the source and the drain, resulting in an increase in the leakage current $I_{DSS}$.

Here, it is known that increasing the impurity concentration of the p-type base layer 104 to $1\times10^{18}$/cm³ reduces the leakage current $I_{DSS}$. However, in the trench MOSFET having the structure described above, the impurity concentration of the p-type base layer 104 is typically a lower value on the order of $1\times10^{17}$/CM³. If this impurity concentration is too high, the threshold voltage (that is, the gate voltage at which current begins to flow between the drain and the source) becomes too high.

The present invention was made to solve the problems in the conventional technologies described above and aims to provide a silicon carbide semiconductor device and a method of manufacturing the silicon carbide semiconductor device that make it possible to reduce leakage current while maintaining the threshold gate voltage at an appropriate value. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a silicon carbide semiconductor device, including: a drift layer of a first conductivity type formed over an entire front surface of a silicon carbide semiconductor substrate of the first conductivity type; a base layer of a second conductivity type formed over an entire surface layer of the drift layer; a first trench formed in a surface layer of the base layer; a second trench of a narrower width than the first trench, the second trench being formed in a bottom of the first trench and reaching the drift layer; source regions of the first conductivity type formed in the surface layer of the base layer, on sidewalls of the first trench, and on bottom portions of the first trench; an impurity region of the second conductivity type selectively formed in the surface layer of the base layer having the source regions formed therein, the impurity region reaching the base layer thereunder; a gate electrode embedded in the first trench and the second trench with a gate oxide film interposed between the gate electrode and the first and second trenches; an interlayer insulating film formed covering the gate electrode; a source electrode formed contacting the impurity region and the source region; and a drain electrode formed on a rear surface side of the silicon carbide semiconductor substrate, wherein a thickness of the base layer is set so that a concentration of ion species or point defects running along dislocations in the base layer is so low that regions surrounding the dislocations do not conduct current due to the ion species or the point defects.

Moreover, in the silicon carbide semiconductor device according to one aspect of the present invention, the thickness of the base layer may be greater than or equal to 8 μm.

Furthermore, in the silicon carbide semiconductor device according to one aspect of the present invention, the thickness of the base layer may be greater than or equal to 12 μm.

In another aspect, the present disclosure provides a method of manufacturing a silicon carbide semiconductor device, including: layering a drift layer of a first conductivity type over an entire front surface of a silicon carbide semiconductor substrate of the first conductivity type; layering a base layer of a second conductivity type over an entire surface layer of the drift layer; forming a first trench in a surface layer of the base layer; forming a first source region of the first conductivity type in the surface layer of the base layer, on a left sidewall of the first trench, and on a left bottom portion of the first trench; forming a second source region of the first conductivity type in the surface layer of the base layer, on a right sidewall of the first trench, and on a right bottom portion of the first trench; forming, in a bottom of the first trench, a second trench having a narrower width than the first trench and going through the base layer and reaching the drift layer; selectively forming, in the surface layer of the base layer having the first and second source regions formed therein, an impurity region of the second conductivity type reaching the base layer thereunder; forming a gate electrode in the first trench and the second trench with a gate oxide film interposed between the gate electrode and the first and second trenches; forming an interlayer insulating film covering the gate electrode; forming a source electrode contacting the first and second source regions and the impurity region; and forming a drain electrode on a rear surface side of the silicon carbide semiconductor substrate, wherein in the step of layering the base layer, the base layer is layered to such a thickness that a concentration of ion species or point defects running along dislocations in the base layer after activation of impurities in the first and second source regions is so low that regions surrounding the dislocations do not conduct current due to the ion species or the point defects.

In the aspects of the present invention described above, setting the film thickness of the p-type epitaxial base layer (the base layer of the second conductivity type) to be large makes it possible to set the concentration of the ion species or point defects along screw dislocations to a concentration at which the n-type regions surrounding the screw dislocations do not conduct current. This makes it possible to reduce conduction of current between the source region and drift layers and thereby makes it possible to reduce leakage current in the OFF state. Moreover, forming the n-type source regions in the sidewalls and bottom portions of the first trenches and also forming the second trenches makes it possible to prevent increases in channel length and thereby makes it possible to prevent increases in channel resistance.

Furthermore, setting the film thickness of the p-type epitaxial base layer to 8 µm or greater sufficiently reduces point defect concentration and makes it possible to set the concentration of point defects along screw dislocations to a value at which the n-type regions surrounding the screw dislocations do not conduct current. Moreover, setting the film thickness of the p-type epitaxial base layer to 12 µm or greater makes the point defect concentration substantially equal to 0, thereby making it possible to prevent the n-type regions surrounding the screw dislocations from conducting current.

The silicon carbide semiconductor device and the method of manufacturing the silicon carbide semiconductor device according to the present invention make it possible to reduce leakage current while maintaining the threshold gate voltage at an appropriate value.

It is to be understood that both the foregoing general description and the following detailed description are exemplary and explanatory, and are intended to provide further explanation of the invention as claimed.

DETAILED DESCRIPTION OF EMBODIMENTS

Figure 1:
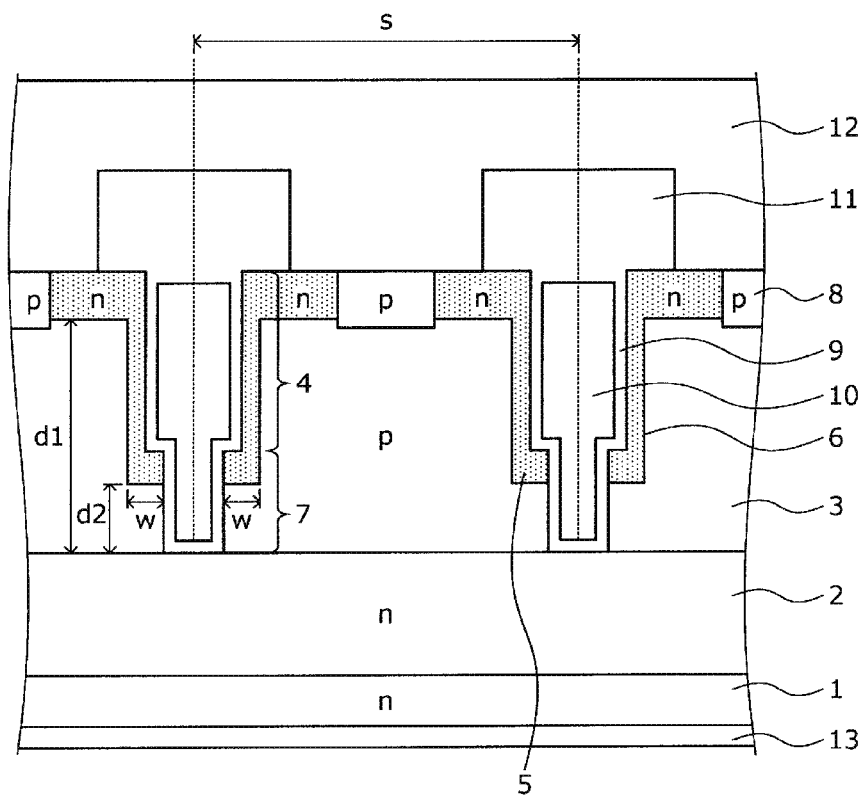
FIG. 1 is a cross-sectional view illustrating the structure of a silicon carbide semiconductor device according to an embodiment.

Preferred embodiments of a silicon carbide semiconductor device and a method of manufacturing the silicon carbide semiconductor device according to the present invention will be described in detail below with reference to figures. In the present specification and the attached drawings, the letters "n" and "p" are used to indicate whether the majority carriers in a layer or region are electrons or holes, respectively. Moreover, the symbols + and − are appended to the letters n and p to indicate layers or regions having a higher or lower impurity concentration, respectively, than layers or regions in which the + and − symbols are not appended. Layers and regions that are labeled with the same n and p (and + and −) notation have approximately the same impurity concentration but are not limited to having exactly the same impurity concentration. Moreover, in the following description of the embodiment and the attached drawings, the same reference characters are used to indicate components that are the same, and redundant descriptions of such components will be omitted.

Embodiment

FIG. 1 is a cross-sectional view illustrating the structure of a silicon carbide semiconductor device according to an embodiment. As illustrated in FIG. 1, in the silicon carbide semiconductor device according to the present embodiment, an n-type drift layer (a drift layer of a first conductivity type) 2 is deposited onto a first principal surface (the front surface; here, the (0001) plane (Si plane), for example) of an n-type silicon carbide substrate (a silicon carbide semiconductor substrate of the first conductivity type) 1.

The n-type silicon carbide substrate 1 is a single crystal silicon carbide substrate, for example. The n-type drift layer 2 is a low impurity concentration n-type drift layer, for example, having a lower impurity concentration than the n-type silicon carbide substrate 1. A p-type epitaxial base layer (a base layer of a second conductivity type) 3 is formed on the surface of the n-type drift layer 2 on the side opposite to the n-type silicon carbide substrate 1 side. In the following description, the n-type silicon carbide substrate 1, the n-type drift layer 2, and the p-type epitaxial base layer 3 will be referred to collectively as a "silicon carbide semiconductor substrate."

A drain electrode 13 is formed on the second principal surface of the n-type silicon carbide substrate 1 (the rear surface; that is, the rear surface of the silicon carbide semiconductor substrate).

Trench structures are formed in the first principal surface side (the p-type epitaxial base layer 3 side) of the silicon carbide semiconductor substrate. More specifically, first trenches 4 and second trenches 7 are formed. The first trenches 4 reach from the surfaces of n-type source regions 5 and 6 (described later) on the side opposite to the n-type silicon carbide substrate 1 side (that is, from the first principal surface side of the silicon carbide semiconductor substrate) down into the p-type epitaxial base layer 3 and are respectively covered by left n-type source regions 5 and right n-type source regions 6 (described later). Moreover, the second trenches 7 are narrower in width than the first trenches 4 and respectively go from the bottoms of the first trenches 4 through the p-type epitaxial base layer 3 and reach the n-type drift layer 2. A gate oxide film 9 is formed along the inner walls of each first trench 4 and second trench 7 (that is, on the bottoms and the sidewalls of the first trench 4 and the second trench 7), and a gate electrode 10, made of high impurity-doped polysilicon, is formed on the inner side of the gate oxide film 9 inside each first trench 4 and second trench 7. An interlayer insulating film 11 is formed covering the gate electrode 10. The gate oxide film 9 insulates the gate electrode 10 from the n-type drift layer 2 and the p-type epitaxial base layer 3. A portion of the gate electrode 10 may protrude from the top of the first trench 4 (that is, the side on which the interlayer insulating film 11 is formed) towards a source electrode 12 side.

The left n-type source regions (first source regions of the first conductivity type) 5, the right n-type source regions (second source regions of the first conductivity type) 6, and a p-type base contact region (an impurity region of the second conductivity type) 8 are selectively formed in the surface of the p-type epitaxial base layer 3 on the side opposite to the n-type silicon carbide substrate 1 side (that is, on the first principal surface side of the silicon carbide semiconductor substrate). In the following description, the left n-type source regions 5 and the right n-type source regions 6 will also be referred to collectively as "the n-type source regions 5 and 6." The left n-type source regions 5 are respectively formed on the left sidewalls of the first trenches 4 and on the left bottom portions of the first trenches 4, and the right n-type source regions 6 are respectively formed on the right sidewalls of the first trenches 4 and on the right bottom portions of the first trenches 4. Moreover, the n-type source regions 5 and 6 and the p-type base contact region 8 contact the source electrode 12.

Although FIG. 1 only depicts two trench-MOS structures, more of these trench-MOS gate (metal-oxide-semiconductor insulated gate) structures may be arranged in parallel.

As described above, if conventional high temperature annealing were performed, the ion-implanted ion species or point defects formed during formation of the left n-type source regions 5 and the right n-type source regions 6 would diffuse along screw dislocations and thereby convert the regions surrounding the screw dislocations to n-type. These screw dislocations extend from the front surface of the p-type epitaxial base layer 3 to the rear surface of the n-type semiconductor substrate 1, which could potentially allow conductive paths between the source and the drain and result in an increase in leakage current.

Therefore, in the silicon carbide semiconductor device according to the present embodiment, the film thickness of the p-type epitaxial base layer 3 is set to be sufficiently large, with the n-type drift region 2 being separated from the n-type source regions 5 and 6 formed in the surface of the p-type epitaxial base layer 3 by a distance d1. As this distance d1 increases, the concentration of the ion species or point defects along the screw dislocations decreases. Thus, setting the film thickness of the p-type epitaxial base layer 3 to be sufficiently large makes it possible to set the concentration of the ion species or point defects along the screw dislocations to a concentration at which the n-type regions surrounding the screw dislocations do not conduct current.

Figure 2:
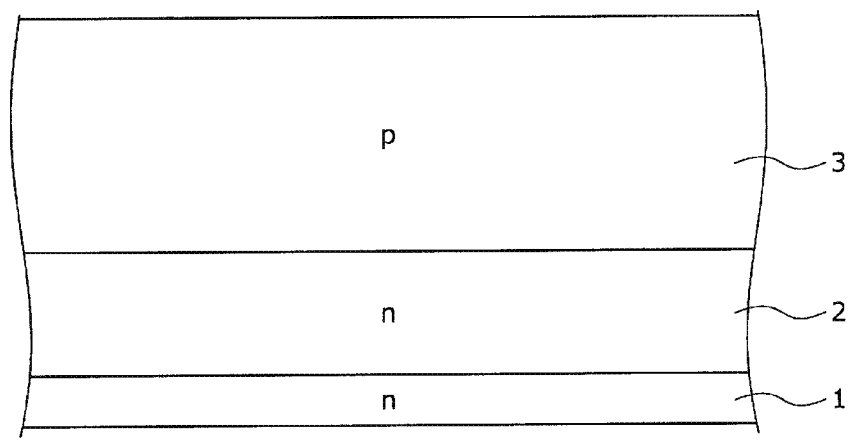
FIG. 2 is a cross-sectional view illustrating a (first) state during manufacture of the silicon carbide semiconductor device according to the embodiment.

The relationship between film thickness and point defect concentration has previously been researched (see FIG. 2 in Reference Document 1 identified below, for example). According to this research, at film thicknesses of greater than or equal to 8 µm, point defect concentration is sufficiently reduced, and the concentration of point defects along screw dislocations becomes equal to a value at which the n-type regions surrounding the screw dislocations do not conduct current. Therefore, it is preferable that the film thickness of the p-type epitaxial base layer 3 be at least 8 µm or greater.

Moreover, according to the same research, point defect concentration becomes substantially equal to 0 at film thicknesses of greater than or equal to 12 µm, thereby making it possible to prevent the n-type regions surrounding the screw dislocations from conducting current. Therefore, it is more preferable that the film thickness of the p-type epitaxial base layer 3 be greater than or equal to 12 µm.

Simply increasing the film thickness of the p-type epitaxial base layer 3 increases channel length and channel resistance and thereby results in an increase in ON-resistance. Therefore, in the present embodiment, the second trenches 7 are formed at the bottoms of the first trenches 4. In this configuration, forming the n-type source regions 5 and 6 on the sidewalls and the bottoms of the first trenches 4 reduces channel length and thereby makes it possible to prevent increases in channel resistance.

Here, it is preferable that the width w of the n-type source regions 5 and 6 at the bottoms of the first trenches 4 be as small as possible. This is because the distance d2 between the n-type drift region 2 and the n-type source regions 5 and 6 at the bottoms of the first trenches 4 is less than the distance d1, which means that it is not possible to reduce the ion species/point defect concentration in regions surrounding screw dislocations going from the n-type source regions 5 and 6 at the bottoms of the first trenches 4 to the n-type drift region 2 and can therefore potentially result in formation of conductive paths therebetween. Thus, making the width w as small as possible reduces the number of screw dislocations going from the n-type source regions 5 and 6 at the bottoms of the first trenches to the n-type drift region 2 and thereby reduces formation of conductive paths between the source and the drain.

The minimum value for the width w is determined by the amount of alignment error between the first trenches 4 and the second trenches 7. A typical amount of alignment error is 0.05 µm, and given that this alignment error can occur on both sides of the first trenches 4, the minimum width w is twice this 0.05 µm value, or 0.1 µm.

Meanwhile, the maximum value for the width w is determined by the desired yield rate and cell pitch for the silicon carbide semiconductor device. Reducing the area of the n-type source regions 5 and 6 decreases the number of screw dislocations, thereby decreasing dislocation density and making it possible to increase yield rate. In a conventional silicon carbide semiconductor device having an active area of 9 mm$^2$ and manufactured at a yield rate of 1%, when the dislocation density becomes greater than approximately 51/cm$^2$, the leakage current $I_{DSS}$ takes a large value of 10$^{-3}$ A/cm$^2$ to 10$^{-1}$ A/cm$^2$. Here, "active area" refers to the area of the active region in which the device structures are formed and through which current flows when the device is in the ON state.

The relationship between this area and yield rate is logarithmic, and therefore improving yield rate from 1% to x % requires reducing this area to a factor of ln(x)/ln(0.01). Here, ln is the natural logarithm.

Moreover, for a silicon carbide semiconductor device having a stripe-shaped structure of cell pitch s, the area of the n-type source regions 105 in the conventional silicon carbide semiconductor device would be s×total stripe length. Here, the cell pitch s is the distance between the centers of the first trenches 4, and the total stripe length is the sum of the lengths of each stripe in the silicon carbide semiconductor device. Also, the area of the n-type source regions 5 and 6 in the silicon carbide semiconductor device according to the embodiment is 2 w×total stripe length.

Therefore, to increase the yield rate of 1% for the conventional silicon carbide semiconductor device to a yield rate of x % for the silicon carbide semiconductor device according to the present embodiment, the maximum value for the width w is given by (2 w×total stripe length)/(s×total stripe length)=(ln(x)/ln(0.01)), which can be simplified to w=s×(ln(x)/ln(0.01))/2. In other words, in order to improve yield rate from 1% to x % for a silicon carbide semiconductor device having a stripe-shaped structure of cell pitch s, the width w must be less than or equal to the maximum value given above.

More specifically, to improve the yield rate of 1% for the conventional silicon carbide semiconductor device to a yield rate of 80% for the silicon carbide semiconductor device according to the embodiment, for example, the area of the bottoms of the n-type source regions 5 and 6 should be reduced to ln(0.8)/ln(0.01)=0.048, or 4.8%. Therefore, the maximum value for the width w is s×(ln(0.8)/ln(0.01))/2=s× 0.048/2.

For example, when the cell pitch s is 5 µm, the maximum value for the width w is 0.12 µm, and when the cell pitch s is 7 µm, the maximum value for the width w is 0.17 µm. Moreover, when the cell pitch s is 4 µm, the maximum value for the width w is 0.095 µm. However, this is less than the minimum value for the width w (0.1 µm), which means that the yield rate of 80% cannot be achieved when the cell pitch s is 4 µm.

(Reference Document 1) Takeshi Mitani et al., "Depth Profiling of Al Ion-Implantation Damage in SiC Crystals by Cathodoluminescence Spectroscopy," (United States), Materials Science Forum Vols. 600-603 (2009) pp. 615-618

(Method of Manufacturing Silicon Carbide Semiconductor Device of Embodiment)

Next, a method of manufacturing the silicon carbide semiconductor device according to the embodiment will be described. FIGS. 2 to 5 are cross-sectional views schematically illustrating states during manufacture of the silicon carbide semiconductor device according to the embodiment.

First, the n-type silicon carbide substrate 1 made of n-type silicon carbide is prepared. Then, the n-type drift layer 2 made of silicon carbide is epitaxially grown to a thickness of approximately 30 µm, for example, on the first principal surface of the n-type silicon carbide substrate 1 while doping with n-type impurities such as nitrogen atoms. The epitaxial growth parameters for forming the n-type drift layer 2 may be set such that the resulting impurity concentration of the n-type drift layer 2 is approximately $3 \times 10^{15}/cm^3$, for example.

Next, the p-type epitaxial base layer 3 is epitaxially grown to a thickness of greater than or equal to 8 µm and preferably to a thickness of greater than or equal to 12 µm on the surface of the n-type drift layer 2 while doping with p-type impurities such as aluminum atoms, for example. The steps thus far form the silicon carbide semiconductor substrate in which the n-type drift layer 2 and the p-type epitaxial base layer 3 are layered onto the n-type silicon carbide substrate 1. The epitaxial growth parameters for forming the p-type epitaxial base layer 3 may be set such that the resulting impurity concentration of the p-type epitaxial base layer 3 is $5 \times 10^{16}/CM^3$ to $2 \times 10^{17}/CM^3$, for example, where it is preferable that the impurity concentration be approximately $1 \times 10^{17}/cm^3$. FIG. 2 illustrates the state of the device up to this point.

Next, using photolithography technology, a mask (not illustrated in the figures) having the desired openings and made of an oxide film, for example, is formed on the surface of the p-type epitaxial base layer 3. Then, using this oxide film as a mask, dry etching or the like is performed to form the first trenches 4 reaching down into the p-type epitaxial base layer 3. Next, the mask used to form the first trenches 4 is removed.

Figure 3:
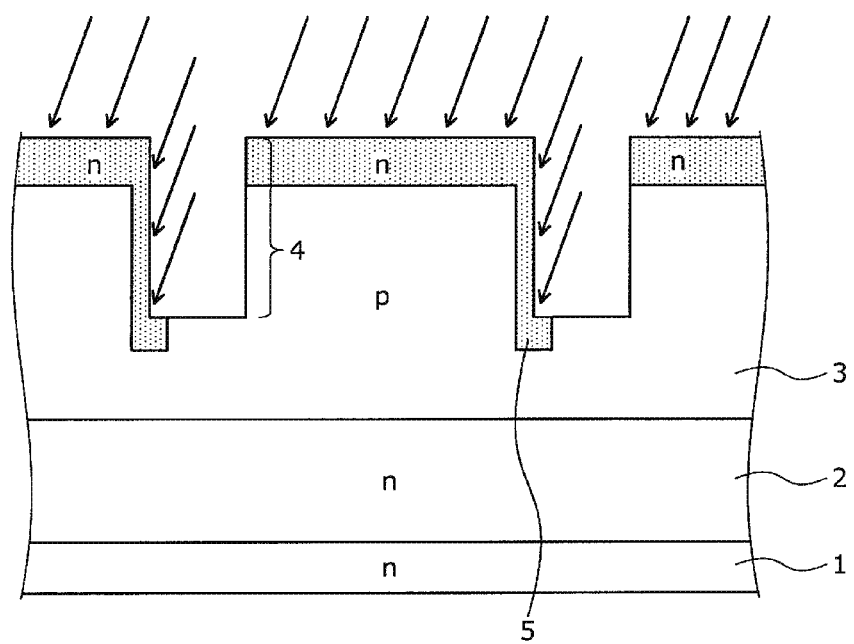
FIG. 3 is a cross-sectional view illustrating a (second) state during manufacture of the silicon carbide semiconductor device according to the embodiment.

Then, using ion implantation, n-type impurities such as nitrogen atoms are ion-implanted into the surface of the p-type epitaxial base layer 3 from a right diagonal direction on the page. The arrows in FIG. 3 illustrate how the ions are implanted from the right diagonal direction on the page. In this way, the left n-type source regions 5 are formed in the surface layer of the p-type epitaxial base layer 3, in the left sidewalls of the first trenches 4, and in the left bottom portions of the first trenches 4. The dose used during the ion implantation for forming the left n-type source regions 5 may be set such that the resulting impurity concentration is approximately $1 \times 10^{17}/cm^3$, for example. FIG. 3 illustrates the state of the device up to this point.

Figure 4:
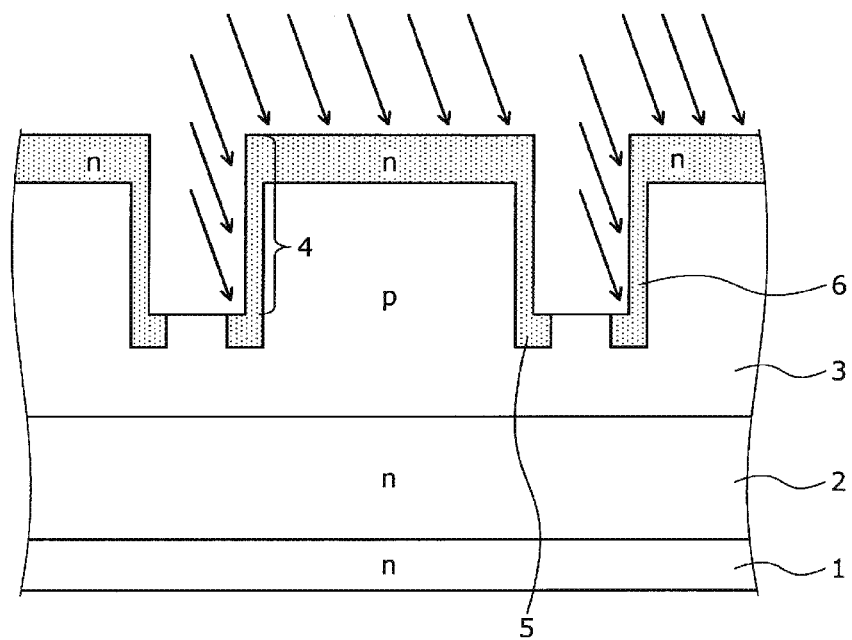
FIG. 4 is a cross-sectional view illustrating a (third) state during manufacture of the silicon carbide semiconductor device according to the embodiment.

Next, using ion implantation, n-type impurities such as nitrogen atoms are ion-implanted into the surface of the p-type epitaxial base layer 3 from a left diagonal direction on the page. The arrows in FIG. 4 illustrate how the ions are implanted from the left diagonal direction on the page. In this way, the right n-type source regions 6 are formed in the surface layer of the p-type epitaxial base layer 3, in the right sidewalls of the first trenches 4, and in the right bottom portions of the first trenches 4. The dose used during the ion implantation for forming the right n-type source regions 6 may be set such that the resulting impurity concentration is approximately $1 \times 10^{17}/cm^3$, for example. FIG. 4 illustrates the state of the device up to this point.

Here, the order in which the left n-type source regions 5 and the right n-type source regions 6 are formed may be reversed. In other words, the left n-type source regions 5 may be formed after forming the right n-type source regions 6.

Figure 5:
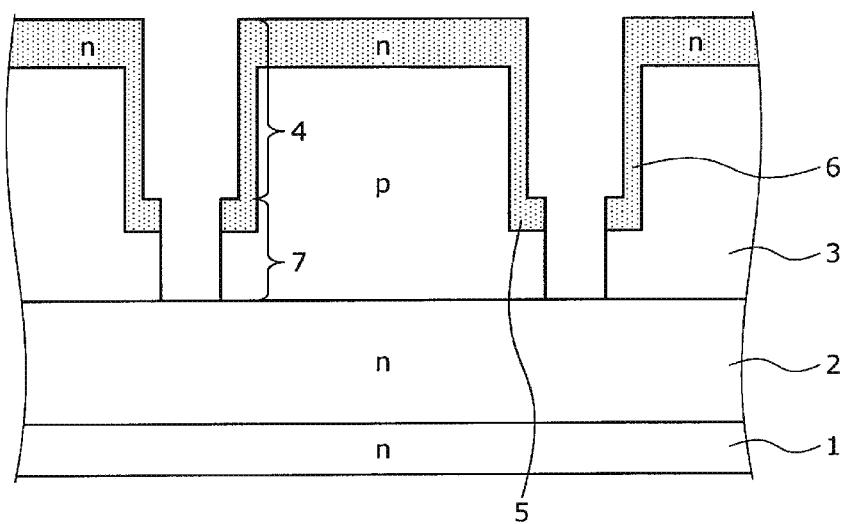
FIG. 5 is a cross-sectional view illustrating a (fourth) state during manufacture of the silicon carbide semiconductor device according to the embodiment.
Figure 6:
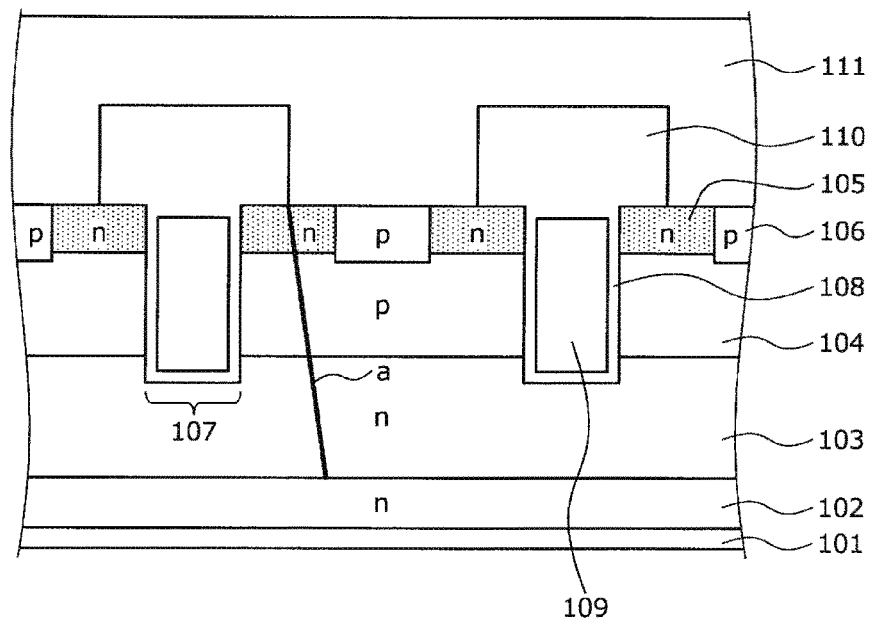
FIG. 6 is a cross-sectional view illustrating the structure of a conventional trench MOSFET.
Figure 7:
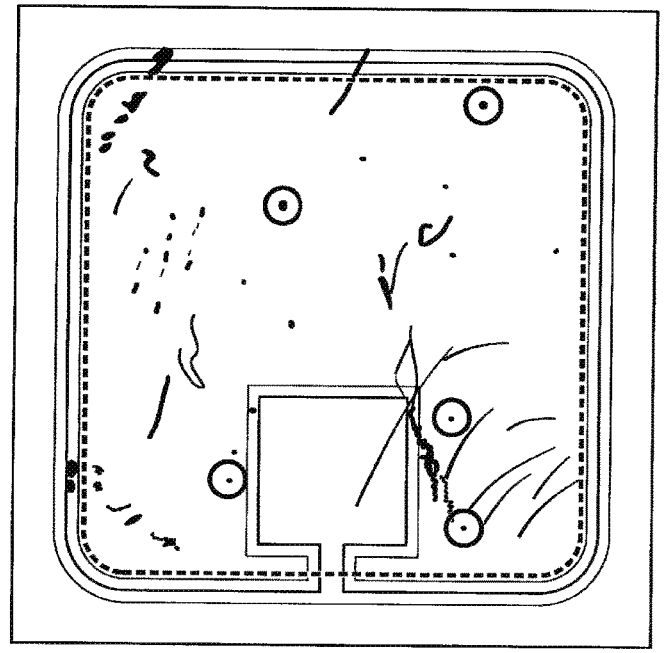
FIG. 7 is an emission image of a silicon carbide trench MOSFET chip with high leakage current.
Figure 8:
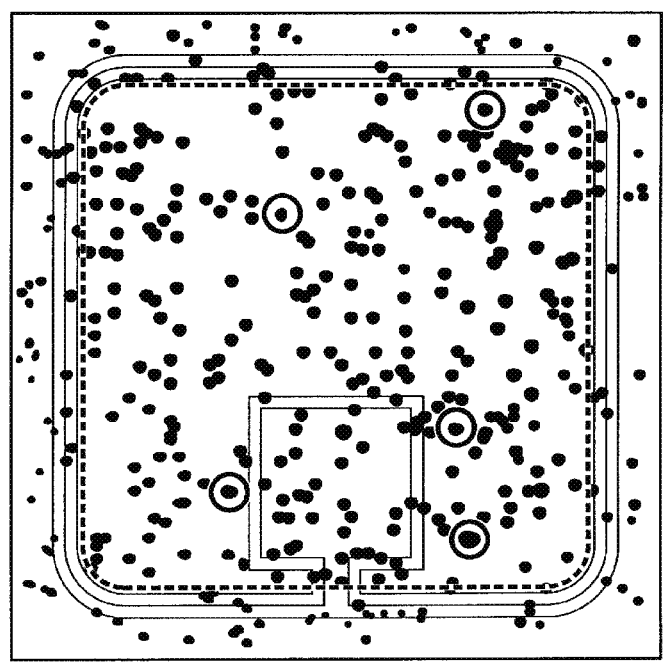
FIG. 8 is an etch pit image of the substrate surface of the silicon carbide trench MOSFET chip with high leakage current.

Next, using photolithography technology, a mask (not illustrated in the figures) having the desired openings and made of an oxide film, for example, is formed on the surface of the p-type epitaxial base layer 3 and on the bottoms of the first trenches 4. Then, using this oxide film as a mask, dry etching or the like is performed to form the second trenches 7 going through the p-type epitaxial base layer 3 and reaching the n-type drift layer 2. Next, the mask used to form the second trenches 7 is removed. FIG. 5 illustrates the state of the device up to this point.

Next, a mask (not illustrated in the figures) having the desired openings and made of an oxide film, for example, is formed on the surfaces of the n-type source regions 5 and 6 using photolithography technology, and using this oxide film as a mask, p-type impurities such as aluminum are ion-implanted into the surfaces of the n-type source regions 5 and 6. In this way, the p-type base contact region 8 is formed in a portion of the surface region of the n-type source regions 5 and 6. The dose used during the ion implantation for forming the p-type base contact region 8 may be set such that the resulting impurity concentration is greater than that of the p-type epitaxial base layer 3, for example. Then, the mask used during the ion implantation for forming the p-type base contact region 8 is removed.

Next, a heat treatment (annealing) is performed to activate the n-type source regions 5 and 6 and the p-type base contact region 8, for example. The temperature at which the heat treatment is performed may be approximately 1600° C., for example. The duration of the heat treatment may be approximately 2 minutes, for example. The heat treatment may be performed one time as described above to activate all of the ion-implanted regions at once, or the heat treatment may be performed after each ion implantation.

Next, the gate oxide film 9 is formed along the surfaces of the n-type source regions 5 and 6 and the p-type base contact region 8 and along the bottoms and sidewalls of the first and second trenches 4 and 7. The gate oxide film 9 may be formed using thermal oxidation in which a heat treatment is performed in an oxygen atmosphere at a temperature of approximately 1200° C. Alternatively, the gate oxide film 9 may be formed using deposition based on a chemical reaction such as high temperature oxidation (HTO).

Next, a polycrystalline silicon layer doped with phosphorus atoms, for example, is formed on the gate oxide film 9. This polycrystalline silicon layer is formed filling the interiors of the first and second trenches 4 and 7. The polycrystalline silicon layer is then patterned and left remaining only inside the first and second trenches 4 and 7 to form the gate electrodes 10. A portion of each gate electrode 10 may protrude from the top of the respective first trench 4 (that is, the side on which the interlayer insulating film 11 is formed) towards the source electrode 12 side.

Next, a phosphosilicate glass film with a thickness of approximately 1 μm, for example, is formed covering the gate oxide film 9 and the gate electrodes 10 to form the interlayer insulating film 11. The interlayer insulating film 11 and the gate oxide film 9 are then selectively removed using patterning to form contact holes, thereby exposing the n-type source regions 5 and 6 and the p-type base contact region 8. Then, a heat treatment (reflow) is performed to planarize the interlayer insulating film 11.

Next, a film such as an aluminum-silicon (Al—Si) alloy film that becomes the source electrode 12 is formed inside the contact holes and on the interlayer insulating film 11. This conductive film is then selectively removed to leave the source electrode 12 in designated areas including the inside of the contact holes, for example.

Next, the drain electrode 13 made of a nickel (Ni) film, for example, is formed on the second principal surface of the n-type silicon carbide substrate 1. Then, a heat treatment is performed at a temperature of approximately 1000° C., for example, to form an ohmic contact between the n-type silicon carbide substrate 1 and the drain electrode 13.

Next, an aluminum film with a thickness of approximately 5 μm is formed covering the source electrode 12 and the interlayer insulating film 11 using sputtering, for example. Then, the aluminum film is selectively removed but left covering the entire active portion of the device, thereby forming a source electrode pad (not illustrated in the figures).

Next, titanium (Ti), nickel, and gold (Au), for example, are sequentially layered onto the surface of the drain electrode 13 to form a drain electrode pad (not illustrated in the figures). This completes the silicon carbide semiconductor device illustrated in FIG. 1.

When the acceptable leakage current $I_{DSS}$ for an active region of 9 mm$^2$ is set to 100 nA or less, the yield rate of silicon carbide semiconductor devices that were manufactured according to the present embodiment, meeting this $I_{DSS}$ condition, was improved to approximately 80% (when using a cell pitch of 5 μm) from the yield rate of only approximately 1% typically seen in conventional technologies. Moreover, in the silicon carbide semiconductor devices that were manufactured according to the present embodiment, the threshold voltage was 5V to 6V, the avalanche breakdown voltage (withstand voltage) for the 1200V class devices was sufficiently high at 1500V to 1600V, and there was no evidence of punchthrough.

Thus, in the embodiment as described above, setting the film thickness of the p-type epitaxial base layer to be large makes it possible to set the concentration of the ion species or point defects along screw dislocations to a concentration at which the n-type regions surrounding the screw dislocations do not conduct current. This makes it possible to prevent formation of the conductive paths between the source and drift layers and thereby makes it possible to reduce leakage current in the OFF state. Moreover, forming the n-type source regions in the sidewalls and bottom portions of the first trenches and also forming the second trenches makes it possible to prevent increases in channel length and thereby makes it possible to prevent increases in channel resistance.

Furthermore, setting the film thickness of the p-type epitaxial base layer to 8 μm or greater sufficiently reduces point defect concentration and makes it possible to set the concentration of point defects along screw dislocations to a value at which the n-type regions surrounding the screw dislocations do not conduct current. Moreover, setting the film thickness of the p-type epitaxial base layer to 12 μm or greater makes the point defect concentration substantially equal to 0, thereby making it possible to prevent the n-type regions surrounding the screw dislocations from conducting current.

Various modifications can be made to the present invention as described above without departing from the spirit of the present invention. For example, the dimensions, impurity concentrations, and the like used for each portion of the device in the embodiment described above can be configured as necessary to satisfy design requirements or the like. Moreover, although in the embodiment of the present invention as described above the first conductivity type was n-type and the second conductivity type was p-type, the present invention still exhibits all of the same advantageous effects if the first conductivity type is p-type and the second conductivity type is n-type.

INDUSTRIAL APPLICABILITY

The silicon carbide semiconductor device according to the present invention as described above is suitable for application to silicon carbide semiconductor devices having at least two or more p-n junctions, such as trench-gate MOSFETs, insulated-gate bipolar transistors (IGBTs), junction gate field-effect transistors (JFETs), bipolar junction transistors (BJTs), gate turn-off thyristors (GTOs), and thyristors. The present invention is particularly well-suited to application to silicon carbide MOS power semiconductor devices.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A silicon carbide semiconductor device, comprising:
   a drift layer of a first conductivity type formed over an entire front surface of a silicon carbide semiconductor substrate of the first conductivity type;
   a base layer of a second conductivity type formed over an entire surface layer of the drift layer;

a first trench formed in a surface layer of the base layer;
a second trench of a narrower width than the first trench, formed in the base layer below the first trench, the second trench being formed in a bottom of the first trench and reaching the drift layer;
source regions of the first conductivity type formed in the surface layer of the base layer, on sidewalls of the first trench, and on portions of a bottom surface of the first trench, the source regions being further formed in upper portions of sidewalls of the second trench that are connected to the bottom surface of the first trench, the source regions that are on the sidewalls of the first and second trenches and on the portions of the bottom surface of the first trench being formed only in regions adjacent to the respective sidewalls of the first and second trenches and the portions of the bottom surface of the first trench, thereby leaving the base layer of the second conductivity type between bottom surfaces of the source regions that are formed in the surface layer of the base layer and a top surface of the drift layer;
an impurity region of the second conductivity type selectively formed in the surface layer of the base layer having the source regions formed therein, the impurity region reaching the base layer thereunder;
a gate electrode embedded in the first trench and the second trench with a gate oxide film interposed between the gate electrode and the first and second trenches;
an interlayer insulating film formed covering the gate electrode;
a source electrode formed contacting the impurity region and the source regions; and
a drain electrode formed on a rear surface side of the silicon carbide semiconductor substrate,
wherein a thickness of the base layer is set so that a prescribed vertical distance is provided between the top surface of the drift layer and the bottom surfaces of the source regions in the surface layer of the base layer so as to reduce a concentration of ion species or point defects running along dislocations in the base layer, thereby reducing leakage current due to the ion species or the point defects.

2. The silicon carbide semiconductor device according to claim 1, wherein the thickness of the base layer is greater than or equal to 8 μm.

3. The silicon carbide semiconductor device according to claim 1, wherein the thickness of the base layer is greater than or equal to 12 μm.

4. A method of manufacturing a silicon carbide semiconductor device, comprising:
layering a drift layer of a first conductivity type over an entire front surface of a silicon carbide semiconductor substrate of the first conductivity type;
layering a base layer of a second conductivity type over an entire surface layer of the drift layer;
forming a first trench in a surface layer of the base layer;
forming a first source region of the first conductivity type in the surface layer of the base layer, on a left sidewall of the first trench, and on a left portion of a bottom surface of the first trench;
forming a second source region of the first conductivity type in the surface layer of the base layer, on a right sidewall of the first trench, and on a right portion of the bottom surface of the first trench;
forming, in a bottom of the first trench, a second trench having a narrower width than the first trench and going through the base layer and reaching the drift layer;
selectively forming, in the surface layer of the base layer having the first and second source regions formed therein, an impurity region of the second conductivity type reaching the base layer thereunder;
forming a gate electrode in the first trench and the second trench with a gate oxide film interposed between the gate electrode and the first and second trenches;
forming an interlayer insulating film covering the gate electrode;
forming a source electrode contacting the first and second source regions and the impurity region; and
forming a drain electrode on a rear surface side of the silicon carbide semiconductor substrate,
wherein the first and second source regions are formed such that the first and second source regions are further present in upper left and right portions of sidewalls of the second trench that are connected to the bottom surface of the first trench, the first and second source regions that are on the sidewalls of the first and second trenches and on the left and right portions of the bottom surface of the first trench being formed only in regions adjacent to the respective sidewalls of the first and second trenches and the left and right portions of the bottom surface of the first trench, thereby leaving the base layer of the second conductivity type between bottom surfaces of the first and second source regions in the surface layer of the base layer and a top surface of the drift layer, and
wherein in the step of layering the base layer, the base layer is layered to such a thickness that a prescribed vertical distance is provided between the top surface of the drift layer and the bottom surfaces of the source regions in the surface layer of the base layer so as to reduce a concentration of ion species or point defects running along dislocations in the base layer after activation of impurities in the first and second source regions, thereby reducing leakage current due to the ion species or the point defects.

* * * * *